United States Patent [19]

Mathewes, Jr. et al.

[11] Patent Number: 4,875,209
[45] Date of Patent: Oct. 17, 1989

[54] TRANSIENT AND INTERMITTENT FAULT INSERTION

[75] Inventors: James K. Mathewes, Jr., Northborough; Craig A. Chancellor, Upton; H. Frank Howes, Berlin, all of Mass.

[73] Assignee: Raytheon Company, Lexington, Mass.

[21] Appl. No.: 177,286

[22] Filed: Apr. 4, 1988

[51] Int. Cl.[4] .............................................. G06F 11/00
[52] U.S. Cl. ........................................ 371/3; 371/25.1
[58] Field of Search ................... 371/3, 25, 15, 16, 18, 371/20, 29; 364/200, 900

[56] References Cited

U.S. PATENT DOCUMENTS

| | | | |
|---|---|---|---|
| 3,761,695 | 9/1973 | Eichelberger | 235/153 AC |
| 3,783,254 | 1/1974 | Eichelberger | 235/152 |
| 3,784,907 | 1/1974 | Eichelberger | 324/57 DE |
| 3,961,251 | 6/1976 | Hurley et al. | 324/73 AT |
| 3,961,252 | 6/1976 | Eichelberger | 324/73 AT |
| 4,298,980 | 11/1981 | Hajdu et al. | 371/25 |
| 4,328,583 | 5/1982 | Stodola | 371/3 |
| 4,329,640 | 5/1982 | Reiner et al. | 324/73 R |
| 4,340,935 | 7/1982 | Anlauf | 371/3 |
| 4,357,703 | 11/1982 | Van Brunt | 371/15 |
| 4,504,784 | 3/1985 | Goel et al. | 324/73 R |
| 4,519,078 | 5/1985 | Komonytsky | 371/25 |
| 4,561,095 | 12/1985 | Kahn | 371/3 X |
| 4,669,081 | 5/1987 | Mathews | 371/3 |

OTHER PUBLICATIONS

Computer Fault Generator, R. L. Cormier, J. K. Gerken, Jr. and J. A. Laird, IBM Technical Disclosure Bulletin, vol. 11, No. 8, (Jan. 1969) pp. 924–926.
A Logic Design Structure for LSI Testability by E. B. Eichelberger and T. W. Williams, IBM System, pp. 462–468.

Primary Examiner—Michael R. Fleming
Attorney, Agent, or Firm—Walter F. Dawson; Richard M. Sharkansky

[57] ABSTRACT

Fault insertion circuits under programmable control and resident in an integrated circuit (LSI or VLSI) insert transient and intermittent fault classes in addition to a permanent fault class into functional logic on such integrated circuit. Specific fault types programmable for each fault class include a stuck-open fault and bridging faults both wired-AND and wired-OR. The programmable fault insertion circuitry on each integrated circuit interfaces directly or indirectly with a BIT maintenance controller. In addition to verifying test software, a fault tolerant system's error detection and recovery circuits may be verified by fault insertion testing using the transient and intermittent fault insertions.

46 Claims, 9 Drawing Sheets

TRANSIENT AND INTERMITTENT FAULT INSERTION

The Government has rights in this invention pursuant to Contract No. F04701-87-C-0023 awarded by Department of Air Force.

BACKGROUND OF THE INVENTION

This invention relates to the testing of large scale integrated (LSI) circuits, very large scale integrated (VLSI) circuits and fault tolerant systems implemented with such LSI or VLSI circuits using logic scan design (LSD). In particular, this invention provides for the insertion of programmable transient and intermittent faults into each VLSI chip individually or in combination on a module within a system for verifying fault detection.

The insertion of permanent faults into LSI and VLSI circuit devices or systems is described in J. K. Mathewes, Jr. et al., U.S. Pat. No. 4,669,081 issued May 26, 1987 and assigned to the present assignee, the specification thereof being incorporated by reference herein. This patent teaches providing programmable fault insertion circuitry within a large scale integrated circuit to insert permanent fault types such as "stuck at one" and "stuck at zero" faults. The faults are inserted into functional logic which have all internal storage elements functioning as shift register latches that can be serially accessed allowing the internal states to be observed and controlled.

A well known technique for testing LSI devices and systems employing LSI devices using shift register latches to transform sequential circuits into combinational circuits is known as Level Sensitive Scan Design (LSSD) and it is described in U.S. Pat. Nos. 3,761,695, 3,783,254, 7,784,907 and in the publication "A Logic Design Structure for LSI Testability" by E. B. Eichelberger and T. W. Williams, 14th Design Automation Conference Proceedings, IEEE Computer Society, June 20–22, 1977, pages 462–468. In a system employing LSSD, a logic system is defined as being "level sensitive" if, and only if, the steady state response to any allowed input state change is independent of the circuit and wire delays within the system. Also, if an input stage change involves the changing of more than one input signal, then the response must be independent of the order in which they change. A level sensitive system is assumed to operate as a result of a sequence of allowed input changes with sufficient time lapse between changes to allow the system to stabilize in the new internal state. Thus, LSSD testing is performed by shifting test data via a scan input into a serial chain of logic on an LSI device having storage elements implemented with shift register latches, applying test vectors to the primary inputs of the device under test, and shifting the data out resulting from the applied test vectors via a scan output to compare it to known good test data.

Besides permanent type faults such as "stuck at one" and "stuck-at-zero" in VLSI circuits there are other classes of faults such as transient and intermittent faults which are nonpermanent faults. These nonpermanent faults may also occur on circuit boards interconnecting VLSI circuits and result in unreliable operation of the VLSI circuits and the systems in which they are used. Even in fault tolerant systems transient and intermittent faults may cause incorrect system operations; hence, the ability to test for and detect such nonpermanent faults is very important.

Manual techniques have been used for inserting permanent faults, but they tend to be time-consuming since operator intervention is required to configure the system for each fault or subset of a total fault set to be tested. Generally it is difficult to synchronize the fault insertion with the desired system state of operation. Critical timing paths may be degraded to a marginal or inoperable state by manual techniques used to inject faults whereby the test results may be affected or the analysis may be incomplete. Manual techniques for simulating transient and intermittent faults have similar disadvantages.

In addition to the stuck at one and stuck-at-zero types of faults, other types of faults exist such as a stuck-open fault, a wired-AND bridging fault and a wired-OR bridging fault. A stuck-open fault represents a high impedance and no logic voltage level on a signal line whereas a stuck at one represents the constant presence of a logic level voltage. Bridging faults result from signal lines shorting together and result in a mixing of different signals causing incorrect circuit operation.

SUMMARY OF THE INVENTION

In accordance with the present invention fault insertion circuitry for generating fault classes comprising a permanent fault, a transient fault and intermittent faults is resident in an integrated circuit having a plurality of logic arranged for internal logic states to be held in serially accessed registers which are observable and controllable. The means for generating such fault classes has a first input for receiving programmable scan path data words and a first output coupled to an input of the serially accessed registers. A register for storing a fault word of the scan path data words has a serial input, a serial output and a parallel output. The serial input of the fault word register is coupled to a second output of the fault classes generating means, and the serial output is coupled to a second input of the fault classes generating means. The parallel output of the fault word provides a code for generating a plurality of fault types for a time duration in accordance with a third output of the fault classes generating means. The plurality of fault types, which are generated for each one of the fault classes, comprise not only stuck-at-one and stuck-at-zero fault types but also stuck-open, wired-AND bridging and wired-OR bridging fault types. The class and type of fault to be inserted into functional logic of the integrated circuit being tested is programmed by the scan path data words.

In accordance with a further feature of the invention, a fault insertion test system is provided for verifying fault detection in a functional logic portion of an integrated circuit by programming into circuitry resident in such integrated circuit classes of faults comprising a permanent fault, a transient fault and intermittent faults. A programmable BIT maintenance controller provides control and initialization data words to the integrated circuit for selecting a fault and it monitors or detects the effect of the fault inserted into the functional logic. A fault classes generator receives the control and initialization data words and generates one of the fault classes specified by such control data words. The control data words comprise a fault word which is stored in a register coupled to the fault class generator having a serial input, a serial output and a parallel output. The parallel output of the fault word register provides a code to a fault type generator for generating one of a plurality of fault types for a time duration in accordance with a fault insert signal generated by the fault class generator. The fault types listed herein before may be generated for each fault class. The BIT maintenance controller, which is coupled to inputs and outputs of the integrated circuit, comprises means for performing the fault insertion testing wherein the effect of the inserted fault is detected by monitoring scan out serial data from the functional logic being tested. In addition, the controller further comprises means for performing fault insertion testing wherein the effect of the fault insertion is detected by monitoring status data from the functional logic being tested with diagnostic programs operating in the controller.

A further feature of the invention includes a method of fault insertion by generating fault classes comprising a permanent fault, a transient fault and intermittent faults by circuitry resident in an integrated circuit having a plurality of logic arranged for internal logic states to be held in serially accessed registers which are observable and controllable, comprising the steps of generating the fault classes by means having a first input for receiving programmable scan path data words and a first output coupled to an input of the serially accessed registers, storing a fault word of the data words in a register having a serial input, a serial output and a parallel output, the serial input being coupled to a second output of the fault classes generating means and the serial output being coupled to a second input of the fault classes generating means, generating a fault type specified by the fault word for a time duration in accordance with a third output of the fault calsses generating means, and coupling the fault type to the plurality of logic. The step of generating the fault type comprises the step of generating a stuck at a logic one level signal, a stuck at a logic zero level signal, a signal having characteristics of an open circuit, a wired-AND bridging signal or a wired-OR bridging signal.

Other features and advantages of the present invention will become apparent in the detailed description appearing hereinafter.

BRIEF DESCRIPTION OF THE DRAWINGS

Other and further features of the invention will become apparent in connection with the accompanying drawings wherein.

DESCRIPTION OF THE PREFERRED EMBODIMENTS

Figure 1:
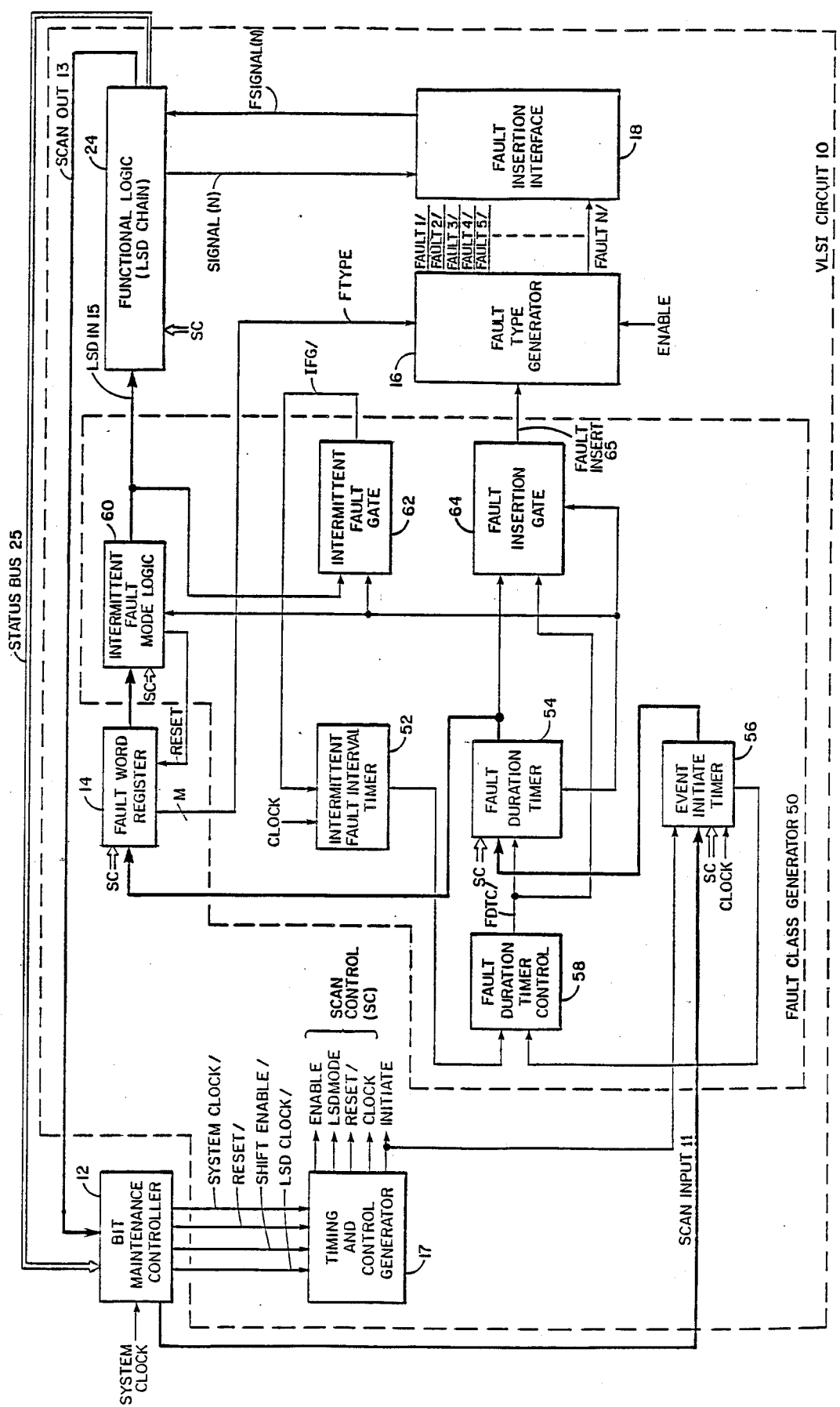
FIG. 1 is a functional block diagram of a fault insertion circuit comprising the invention in a VLSI circuit.

Referring now to FIG. 1, there is shown a block diagram of a very large scale integrated (VLSI) circuit 10 comprising functional logic having a logic scan design (LSD) chain 24 or scan path and permanent and non-permanent programmable fault insertion circuits (PFIC) according to the invention.

A Bit maintenance controller 12 coupled to the VLSI circuit 10 selects a fault class to be applied to the VLSI circuit 10 and determines the response to this fault class by observing the results on either a status bus 25 or a scan out 13 signal line. The fault classes include permanent faults and nonpermanent faults such as transient faults and intermittent faults. In addition, the BIT maintenance controller 12 selects a type of fault to be inserted. There are at least five types of faults which may be inserted into functional logic 24 for each of the fault classes, and they are as follows: stuck-at-one, stuck-at-zero, wired-OR bridging, wired-AND bridging and stuck-open.

Figure 10:
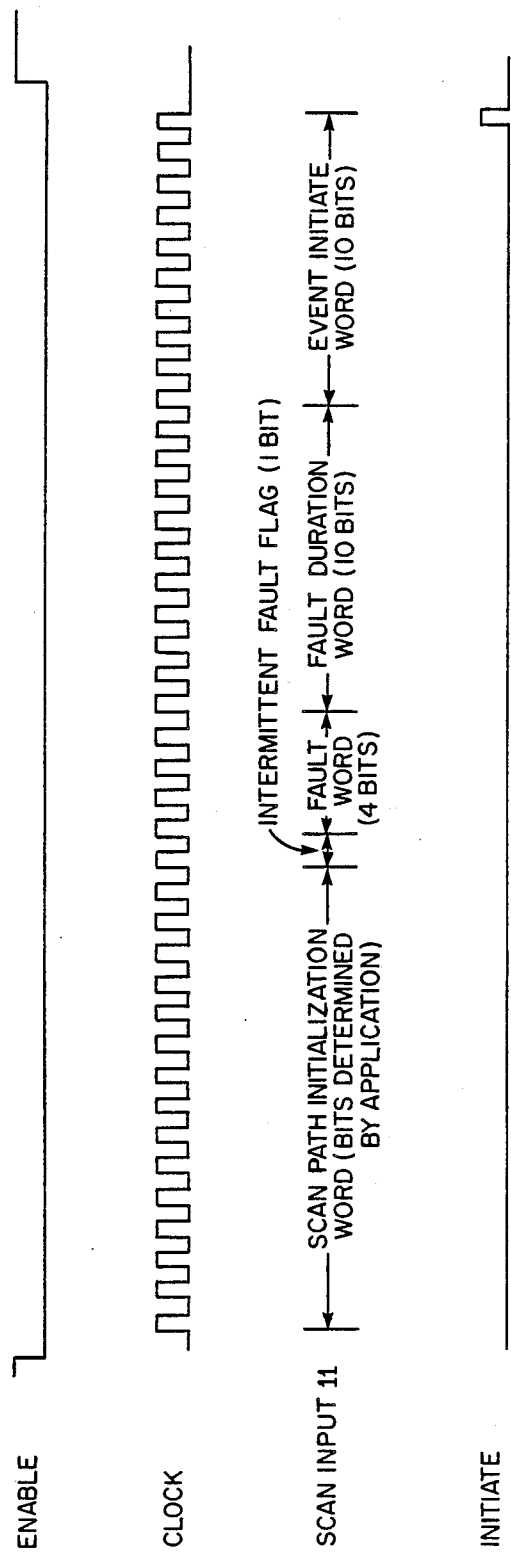
FIG. 10 shows the format of the bit serial, scan path input words along with the timing relationships of control signals CLOCK, ENABLE and INITIATE.

Referring now to FIG. 1 and FIG. 10 the programmable fault insertion circuits (PFIC) comprise a fault class generator 50 which receives a programmable logic scan design (LSD) input or scan input 11 from the external BIT maintenance controller 12. The scan input 11 comprises a combination of bit serial control data words which load certain registers within the fault class generator 50 and a fault word register 14. As shown in FIG. 10, the scan input 11 comprises a scan path initialization word (where the number of bits is determined by the functional logic 24 of a particular application), an intermittent fault flag bit, a 4 bit fault word, a 10 bit fault duration word, and a 10 bit event initiate word. (The path followed by the contents of the scan input 11 is indicated in FIG. 1 by the heavier shaded interconnected lines.) The intermittent fault flag bit, the 10 bit fault duration word and the 10-bit event initiate word are used to control the fault class generator 50 and in particular to provide transient faults and intermittent faults. A portion of the scan input 11 is coupled to a fault word register 14 which stores the fault type number (one of fifteen). Then the scan input 11 is coupled back to the fault class generator 50 to an intermittent fault mode logic 60 for providing information to an intermittent fault flag register therein. The balance of the scan input 11 provides the scan path initialization word to the functional logic 24. The functional logic (LSD chain) 24 comprises a serial interconnection of a functional logic design present of the VLSI circuit 10. The logic design is implemented such that all internal storage elements function as shift register latches or portions of shift register latches that can be serially accessed allowing the internal states to be observed and controlled. The fault class generator 50 is coupled to a fault type generator 16 along with an M-bit parallel output of the fault word register 14 which selects the type of fault to be inserted into functional logic 24. The output of the fault type generator 16 is coupled to a fault insertion interface 18 which provides an appropriate interface circuit to the functional logic 24 in accordance with the fault type selected. When the number of bits in the fault word register 14 equals four (M=4) as in the present embodiment up to fifteen (15) fault insertion interfaces 18 may be selected in addition to a no fault state condition for normal operation of the functional logic 24.

Figure 7:
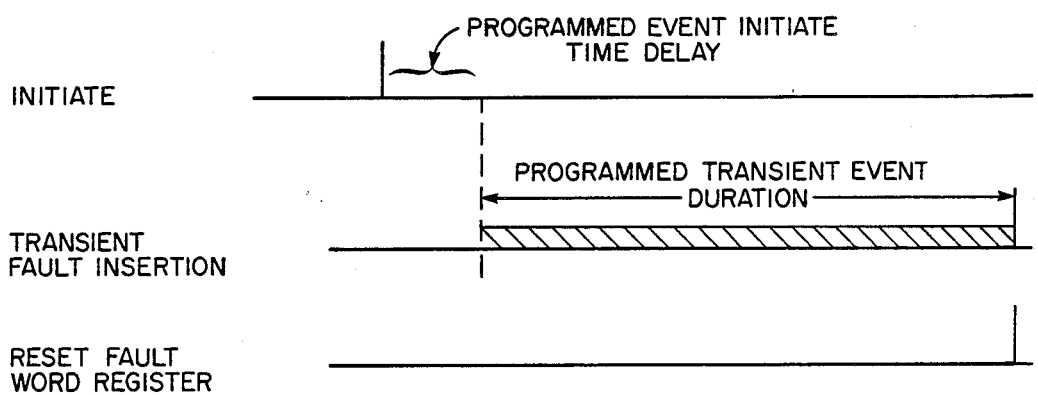
FIG. 7 shows the timing signals for a transient fault insertion.
Figure 8:
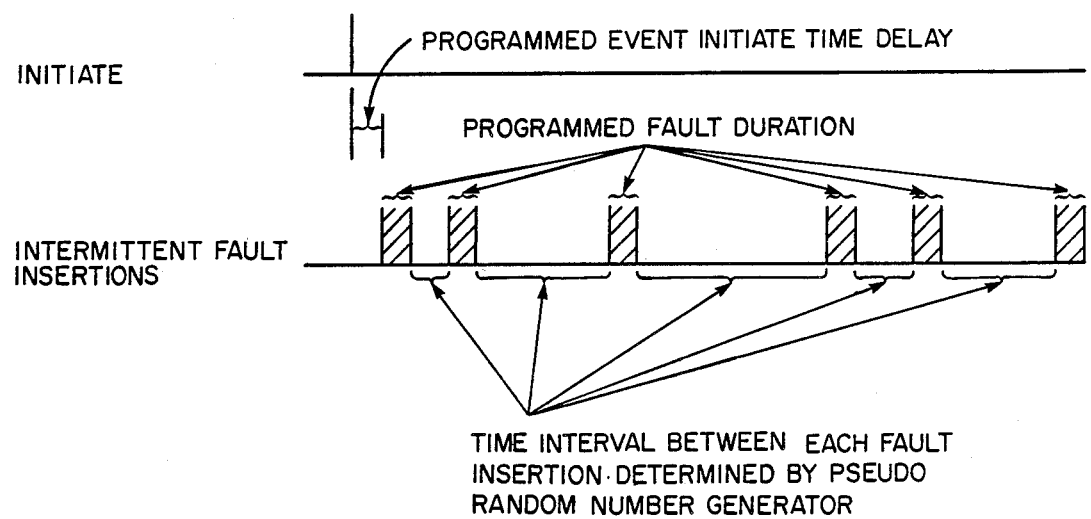
FIG. 8 shows a typical random timing relationship of a plurality of intermittent faults determined by a pseudo-random number generator.

Referring now to FIGS. 1, 7, 8, and 10 the fault class generator 50 comprises three timing circuits in order to generate permanent, transient and intermittent faults and they are an intermittent fault interval timer 52, a fault duration timer 54 and an event initiate timer 56. The intermittent fault interval timer 52 generates a time interval between each intermittent fault insertion as shown in FIG. 8. The fault duration timer 54 determines the time duration of each intermittent fault insertion as shown in FIG. 8 or the duration of a single transient fault insertion as shown in FIG. 7. The event initiate timer 56 provides a programmable event initiate delay as shown in FIG. 7 and FIG. 8 for both a transient fault insertion and an intermittent fault insertion. The event initiate timer 56 and the fault duration timer 54 are in the path of the serial scan control words provided by the BIT maintenance controller 12 at the scan input 11 and these timers 54 and 56 are programmed by the scan input 11 as shown in FIG. 10. The fault duration timer control 58 receives control signals from the output of the intermittent fault interval timer 52 and the output of the event initiate timer 56 and it provides an output signal to the fault duration timer 54 to initiate its operation and also enables a fault insertion gate 64. The fault insertion gate 64 is coupled to a fault type generator 16 which controls the duration of a fault type to be inserted. The intermittent fault mode logic 60 comprises a 1 bit register which stores an intermittent fault flag which is set by the scan input 11 words. If this register is set, an intermittent fault insertion occurs. An output of the intermittent fault mode logic 60 is coupled to an intermittent fault gate 62 which also receives an input from the fault duration timer 54 indicting that a fault insertion interval has ended. The intermittent fault gate 62 generates the initial and all subsequent fault insertion events during an intermittent fault insertion cycle and is coupled to the intermittent fault interval timer 52.

Figure 2:
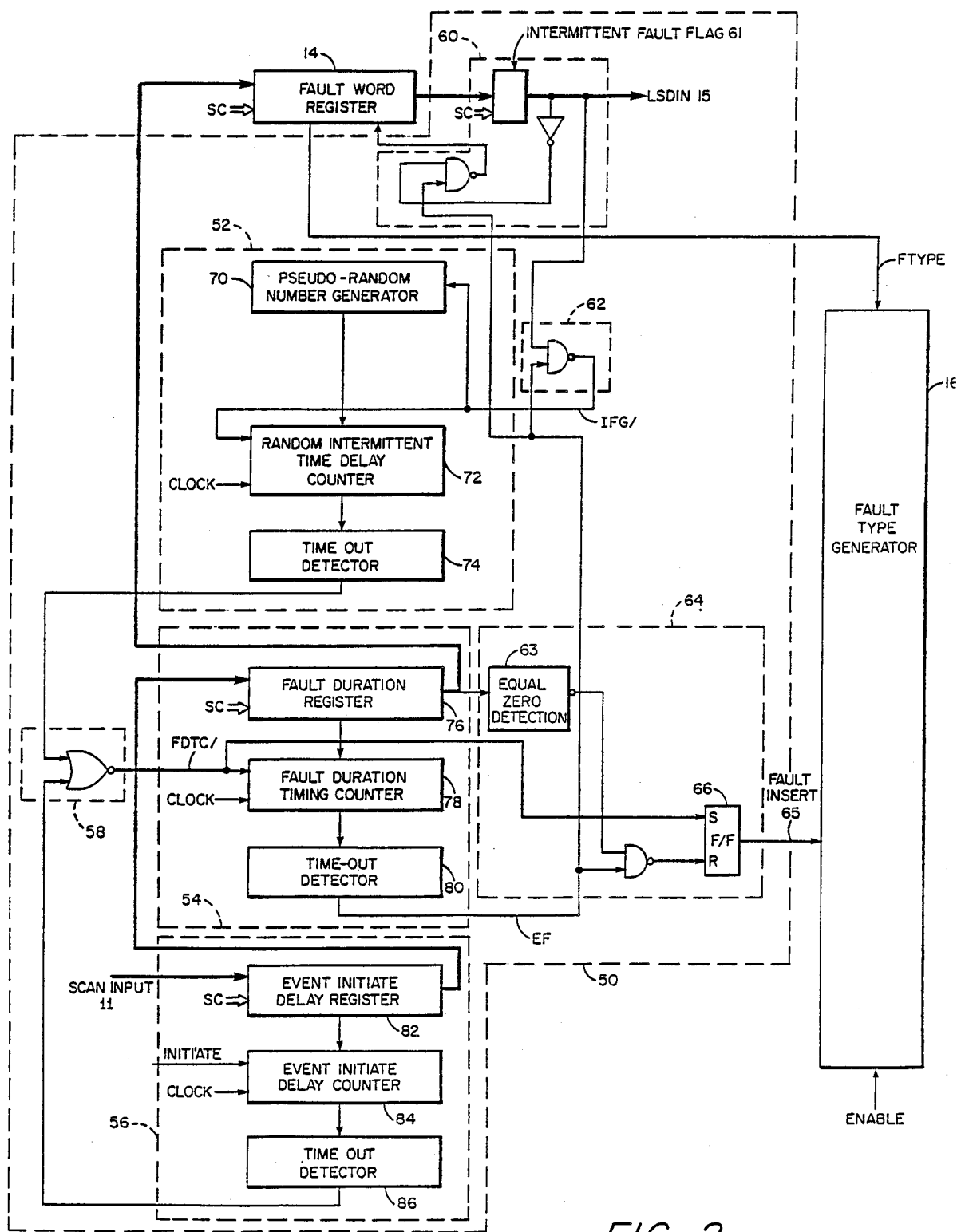
FIG. 2 is a detailed block diagram of the invention.

Referring now to FIG. 2 and FIG. 10, a detailed block diagram of the fault class generator 50 is shown. The intermittent fault interval timer 52 comprises a pseudo-random number generator 70 coupled to a random intermittent time delay counter 72 comprising ten counter stages; the number of stages may be varied depending on a particular application. A random number gets loaded from the pseudo-random number generator 70 into the random intermittent time delay counter 72 upon the occurrence of an IFG/ signal from the intermittent fault gate 62. Upon the occurrence of each clock signal at an input of counter 72 (if counter is nonzero), it counts down, and when it reaches zero, a time-out detector 74 generates a signal to the fault duration timer control 58. The fault duration timer control 58 output is coupled to the fault duration timer 54 which comprises a fault duration register 76 for storing a 10 bit fault duration word received from the scan input 11 as shown in FIG. 10. The scan control (SC) signals from a timing and control generator 17 comprising an ENABLE, LSD MODE, RESET/, AND CLOCK are provided to the fault duration register 76 for register control especially during the fault insertion set-up cycle when the scan input 11 words are loaded (a slash "/" after a signal name such as RESET/ indicates that the signal is asserted when the signal is at a zero volt level). The contents of the fault duration register 76 are loaded into a fault duration timing counter 78 when the FDTC/ signal from the fault duration timer control 58 is received. The CLOCK signal into the fault duration timing counter 78 decrements the counter (if counter is nonzero) until it reaches zero, and then a time-out detector 80 coupled to the outputs of the fault duration timing counter 78 generates an end fault (EF) signal which is coupled to the fault insertion gate 64, intermittent fault gate 62 and intermittent fault mode logic 60. The event initiate timer 56 comprises an event initiate delay register 82 which stores a 10 bit event initiate word received from the scan input 11 as shown in FIG. 10. The SC signals are also coupled to the event initiate delay register 82 and the outputs of register 82 are coupled to and loaded into the event initiate delay counter 84 upon receipt of the INITIATE signal as shown in FIG. 10. The CLOCK into the event initiate delay counter 84 decrements the counter 84 (if counter is nonzero) until it reaches zero and then a time-out detector 86 coupled to the output of the event initiate delay counter 84 generates an output signal to the fault duration timer control 58.

Figure 3:
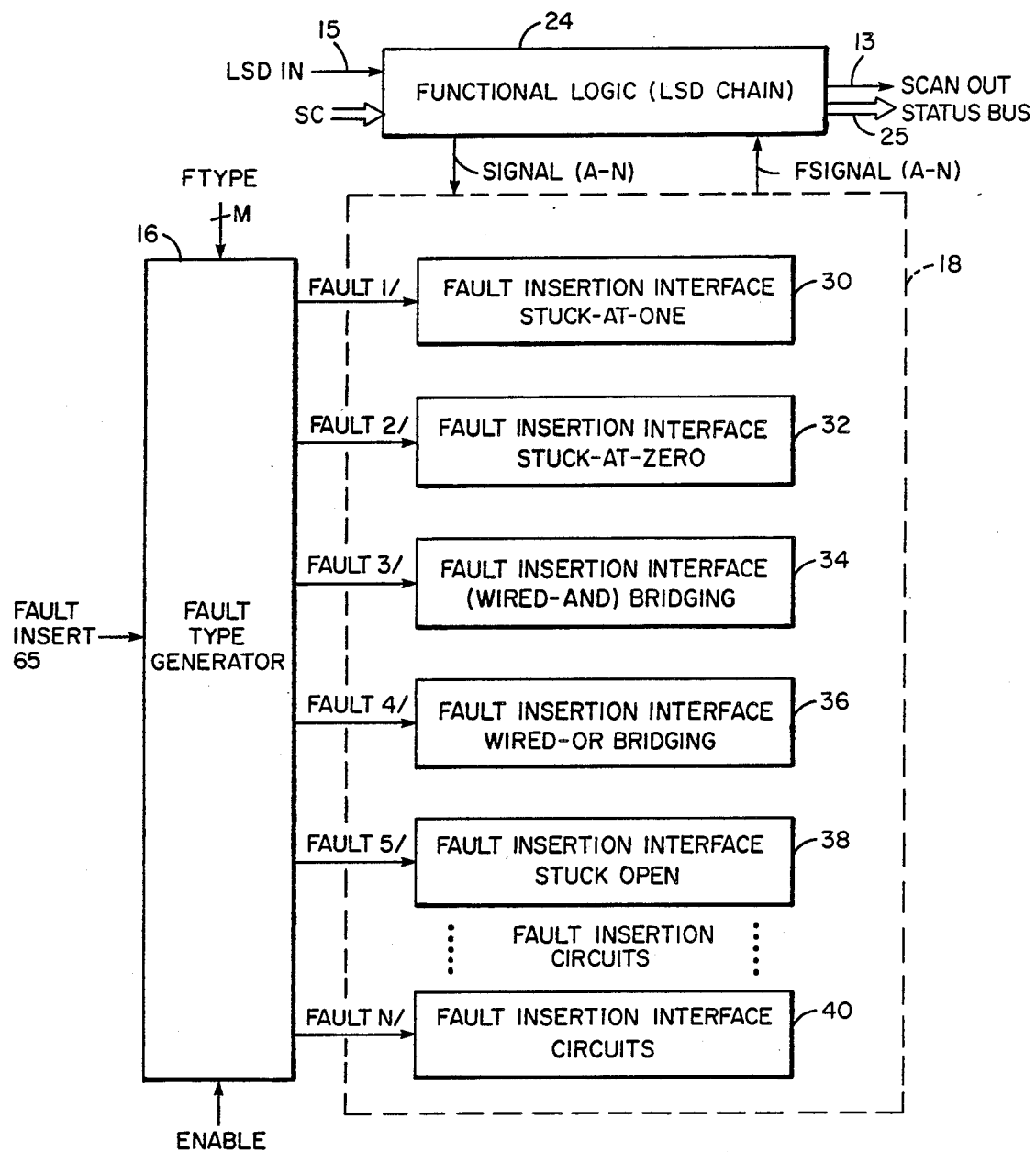
FIG. 3 is a block diagram showing the types of faults generated by the fault type generator interface circuits.

Referring now to FIG. 1 and FIG. 3, the fault word register 14 parallel output, FTYPE, is coupled to a fault type generator 16 which generates one of several possible fault insertion enable signals (FAULT1/ to FAULTN/) when the fault insert (FI) 65 and ENABLE signals are asserted. The FTYPE word is a 4 bit code (M=4) in the present embodiment and a decoding circuit in the fault type generator 16 selects the fault condition specified by the fault word stored in the fault word register 14. The 4 bit FTYPE fault word generates 15 different fault conditions in addition to a default or no fault state condition by decoding means known to one of ordinary skill in the art. Each of the fault types signals FAULT1/ to FAULTN/ is coupled to a fault insertion interface 30-40 which provides the proper signal level to be inserted into the functional logic (LSD chain) 24. The fault insertion interface 30 generates a stuck-at-one fault in response to the FAULT1/ signal by generating a FSIGNALA signal which asserts a logic one level. The fault insertion interface 32 generates a stuck at zero fault in response to the FAULT2/ signal by generating a FSIGNALB/ signal which asserts a logic zero level. The fault insertion interface circuits 30 and 32 are described in the aforementioned U.S. Pat. No. 4,669,081 incorporated herein by reference. Three additional fault interface circuits shown in FIG. 3 are the wired-AND bridging 34, wired-OR bridging 36 and stuck-open 38.

Figure 4:
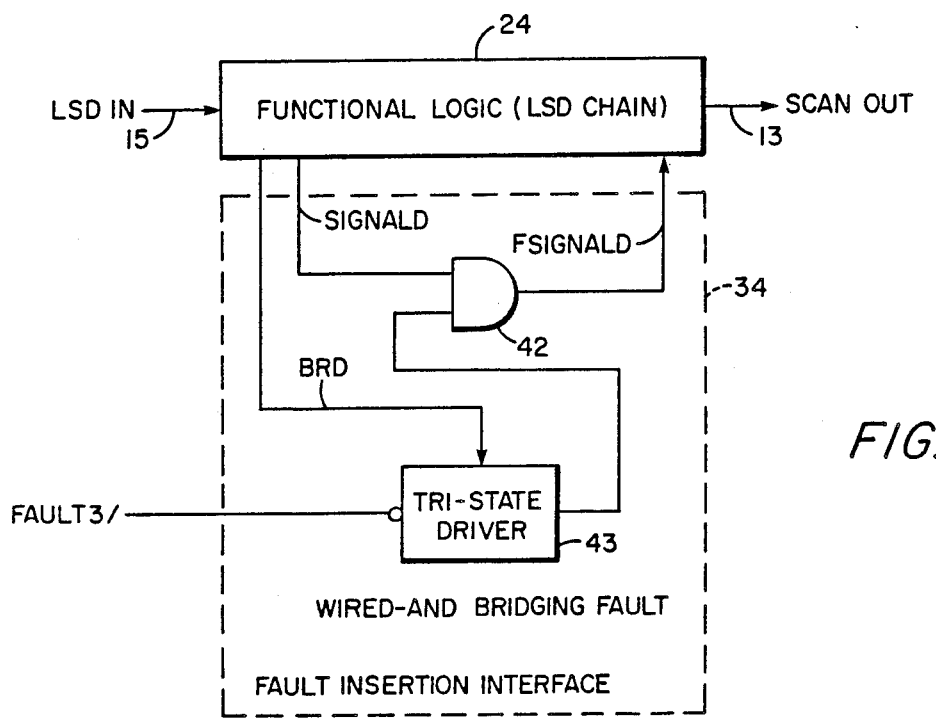
FIG. 4 shows a fault insertion interface circuit for generating a wired-AND bridging fault.

Referring now to FIG. 3 and FIG. 4, FIG. 4 shows the fault insertion interface 34 circuits for the wired-AND bridging fault type. This bridging fault occurs when two independent signal runs become shorted either permanently or nonpermanently and produce a logical AND error condition. For example, in FIG. 4 ordinarily SIGNALD and FSIGNALD are the same signal run in functional logic 24; also, signal BRD is a separate independent signal run within the functional logic 24. However, the fault insertion interface 36 inserts AND gate 42 in the SIGNAL line under the control of tri-state driver 43. When the FAULT3/ signal is not asserted, the tri-state driver 43 output coupled to an input of AND gate 42 is a high impedance having no effect on the FSIGNALD signal. However, when the FAULT3/ signal is asserted, the tri-state driver 43 is turned-on allowing the signal BRD to be ANDed with SIGNALD; hence, the FSIGNALD is now determined by the logic AND combination of SIGNALD and BRD.

Figure 5:
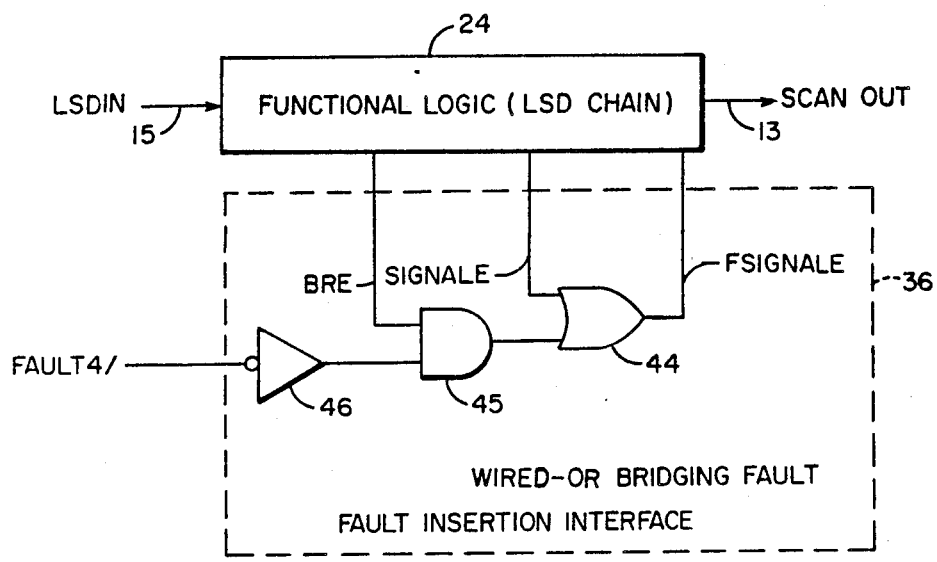
FIG. 5 shows a fault insertion interface circuit for generating a wired-OR bridging fault.

Referring now to FIG. 3 and FIG. 5, FIG. 5 shows the fault insertion interface 36 circuit for the wired-OR bridging fault type. This bridging fault occurs when two independent signal runs become shorted either permanently or nonpermanently and produce a logical-OR error condition. For example, in FIG. 5 ordinarily SIGNALE and FSIGNALE are the same signal run in functional logic 24; also, signal BRE is a separate independent signal run within the functional logic 24. However, the fault insertion interface 36 inserts OR gate 44 in the signal line with an output of AND gate 45 coupled to the other OR gate 44 input. The signal BRE is coupled to an input of AND gate 45 and the output of inverter 46 which receives FAULT4/ signal is coupled to the other input of AND gate 45. When the FAULT4/ signal is not asserted, the AND gate 45 is turned-off and has no effect on the FSIGNALE. However, when FAULT4/ is asserted, the AND gate 45 is turned-on allowing the BRE signal to be OR-gated with the SIGNALE via OR-gate 44; hence, the FSIGNALE is now the logic OR combination of SIGNALE or BRE.

Figure 6:
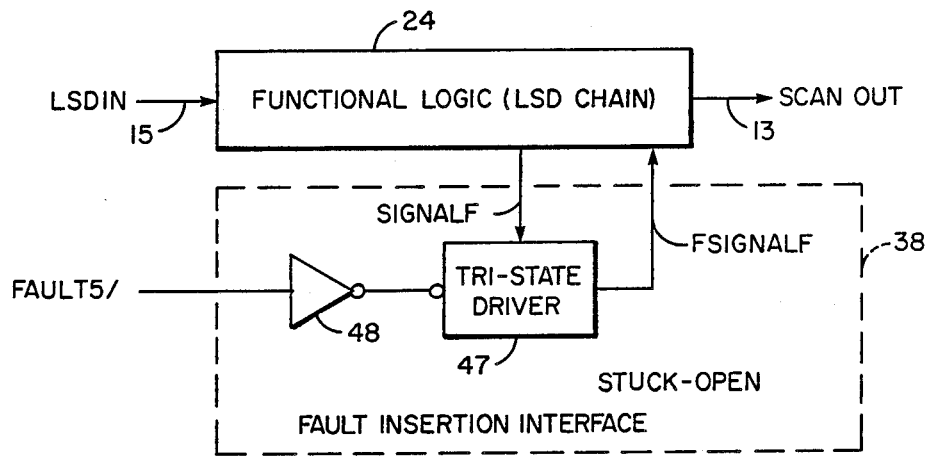
FIG. 6 shows a fault insertion interface circuit for generating a stuck-open fault.

Referring now to FIG. 3 and FIG. 6, FIG. 6 shows the fault insertion interface 38 circuit for the stuck-open fault type. A stuck-open fault in a circuit occurs when a signal run essentially breaks open either permanently or nonpermanently producing an open circuit run. For example, in FIG. 6 ordinarily SIGNALF and FSIGNALF are the same signal run in functional logic 24. However, the fault insertion interface 38 inserts a tri-state driver 47 into this signal run such that a FAULT5/ signal is coupled through inverter 48 to the tri-state driver 47 enable input. When FAULT5/ is not asserted, the tri-state driver 47 is enabled allowing normal operation (i.e. SIGNALF is passed through the tri-state driver 47 to become FSIGNALF). However, when FAULT5/ is asserted, the tri-state driver 47 is turned-off presenting a high impedance to the FSIGNALF line and blocking the signal SIGNALF. The high impedance state of tri-state driver 47 implements a stuck-open fault to the input of a circuit to which the FSIGNALF is coupled.

The BIT maintenance controller 12 inserts faults into a VLSI circuit 10 at all levels of hardware development and test processes. The impact of these faults can be analyzed from the VLSI circuit level up through the system level. Fault analysis is performed by scan path testing and by diagnostic software as determined by the BIT maintenance controller 12.

Figure 9:
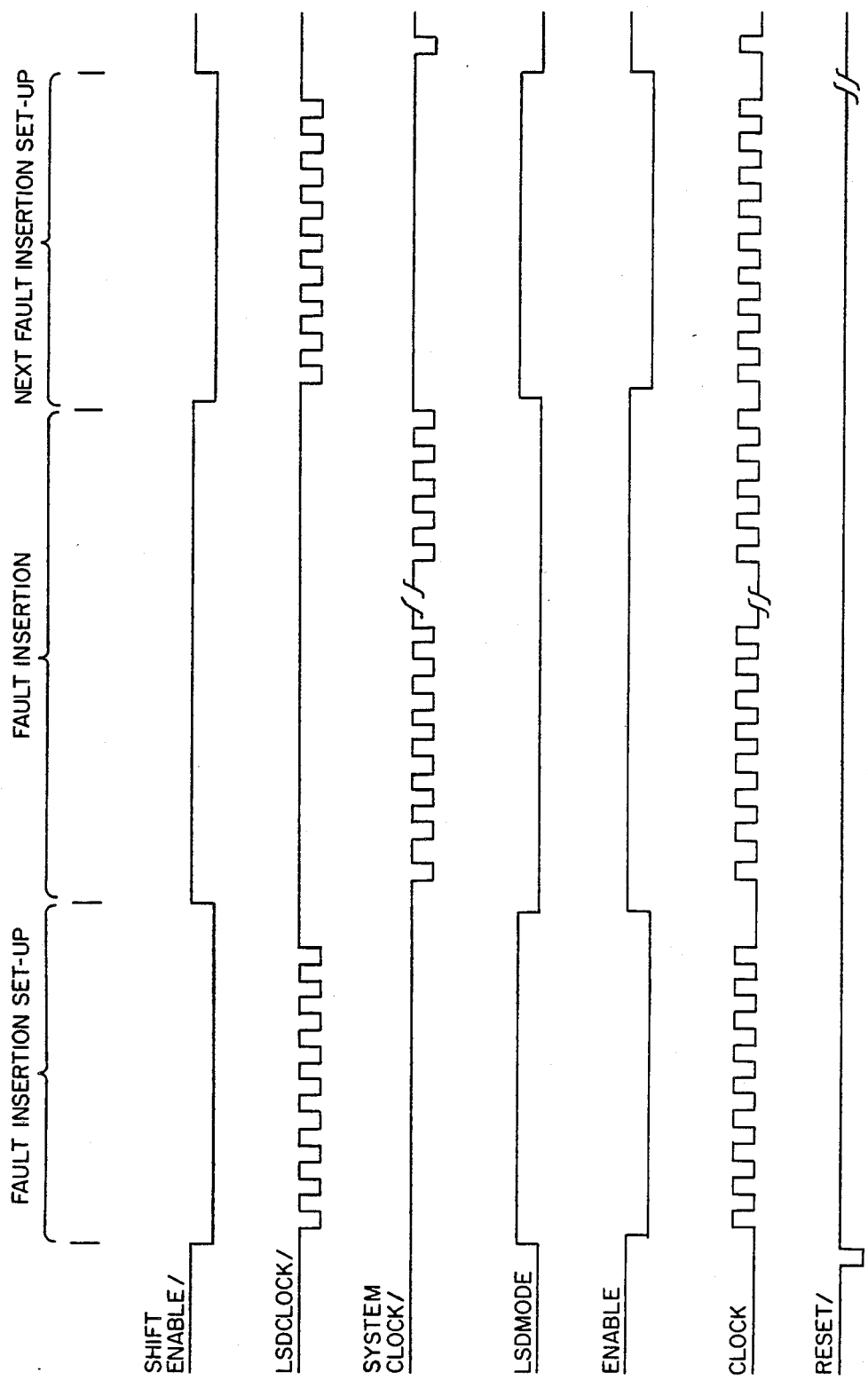
FIG. 9 shows the timing relationships of the signals provided by a BIT maintenance controller and the scan control signals generated on a VLSI circuit during fault insertion set-up cycle, a fault insertion cycle and a next fault insertion set-up cycle.

Scan path testing proceeds with the normal fault insertion set-up according to the timing illustrated in FIGS. 9 and 10 including enough system clocks to insure that the specified fault is inserted. The scan input 11 word format as shown in FIG. 10 has the intermittent fault flag 61 positioned as the most significant bit of the fault class generator 50 control words which also includes the fault duration word (10 bits) and the event initiate word (10 bits). The relative positioning of these control words is arbitrary in accordance with the relative position of the hardware elements in which they are loaded. The scan out 13 data which is shifted out of the functional logic 24 is analyzed by the BIT maintenance controller 12 to examine the effect of the specified fault insertion.

System level fault insertion also proceeds with the normal fault insertion set-up according to the timing as shown in FIG. 9 and FIG. 10; however, the analysis of system level fault insertion is performed by a diagnostic program in the BIT maintenance controller 12 which monitors the status bus 25. The status bus 25 comprises a number of signal lines depending on the specific functional logic 24 being tested. The event initiate timer 56 insures that a minimum interval has elapsed prior to the first fault insertion. Thereafter, a diagnostic program in the BIT maintenance controller 12 exercises the fault insertion circuits in the VLSI circuit 10 and the diagnostic program analyzes via status bus 25 the effect of the inserted fault or faults.

Referring again to FIG. 1, FIG. 2 and FIG. 10, when the BIT maintenance controller 12 inserts a fault, it transmits the fault insertion control words via the scan input 11. FIG. 10 shows the format of scan input 11 data words having a scan path initialization word (the number of bits being determined by a specific application), intermittent fault flag (1 Bit), fault word (4 Bits), fault duration word (10 Bits) and event initiate word (10 bits). The transfer of the scan input 11 words occurs by normal scan path data flow means using the scan control (SC) signals as shown in FIG. 1 and further described in U.S. Pat. No. 4,669,081 previously referenced, and during this transfer the fault insertion circuitry is inhibited. Upon completion of the scan path initialization an INITIATE pulse is generated which loads and enables the event initiate delay counter 84 to start a fault insertion cycle. Once a permanent fault is inserted it remains active until the scan input 11 path is reinitialized by a diagnostic program. A transient fault (single nonpermanent fault insertion) is removed when the fault word register 14 is reset after the specified time-out of the fault duration timing counter 78. A plurality of intermittent faults are pseudo-random initiated each having the same programmed insertion duration.

Referring to FIGS. 1, 2, 7 and 10, when a transient fault is inserted, the BIT maintenance controller 12 transmits a scan input 11 comprising the scan path initialization word, intermittent fault flag (equals logic zero), fault word being inserted, fault duration word and event initiate word. If the fault duration register 76 is loaded with a constant zero, a permanent fault is inserted (the equal zero detector 63 blocks the reset of a flip-flop 66 in fault insertion gate 64 which generates the FAULT INSERT 65 signal); otherwise, the value in the register represents the time duration (counted down by system clock) of a fault insertion, as shown in FIG. 7. During the initialization process the output of the fault type generator 16 is disabled and all FAULTN/ outputs are in the logic one state which insures no faults are inserted. When the event initiate delay counter 84 is counted down to zero, the fault duration timer 54 is loaded with the fault duration word from the fault duration register 76 and the fault insertion gate 64 generates a fault insert (FI) 65 signal thus enabling the fault type generator 16. The fault type generator 16 generates a fault insertion as long as the fault insertion gate 64 is set. Upon count-down of the fault duration timing counter 78 (assuming a non-zero fault duration word was loaded), the time-out detector 80 will generate an EF signal which resets both the fault word register 14 (a zero fault word is the no fault state of the fault type generator 16) and the fault insertion gate 64 thus terminating the inserted transient fault.

Referring to FIGS. 1, 2, 8, and 10, when an intermittent fault is inserted, the BIT maintenance controller 12 transmits a scan input 11 comprising the scan path initialization word, intermittent fault flag (equals logic one), fault word, fault duration word and event initiate word. The value in the event initiate delay register 82 is equal to the delay interval to be counted down prior to the first intermittent fault insertion. The interval between each intermittent fault insertion is determined by the current value in the pseudo-random number generator 70.

During the fault insertion set-up initialization process, the output of the fault type generator 16 is disabled and all FAULT1/ to FAULTN/ outputs are in the logic one state insuring that no faults are inserted. Upon completion of the fault insertion set-up initialization process, the event initiate word stored in the event initiate delay register 82 is loaded by the INITIATE signal into the event initiate delay counter 84. When this counter 84 is down counted by the CLOCK signal to zero, the fault duration timing counter 78 is loaded with the fault duration word and the fault insertion gate 64 generates the fault insert 65 signal, thus initiating the fault insertion type specified by the fault word register 14. Upon time-out of the fault duration counter 78, the fault insertion gate 64 is turned-off, the pseudo-random number generator 70 is loaded into the random intermittent time delay counter 72 and the pseudo-random number generator 70 is advanced to its next state. The intermittent fault mode logic 60 inhibits the resetting of the fault word register 14 thus insuring that the current fault insertion class will not be terminated. The random intermittent time delay counter 72 counts down the interval between the fault insertions, and upon detection of zero an FDTC/ signal generated by the fault duration timer control 58 will reload the fault duration timer 54 to insert the next fault and continue the intermittent fault insertion cycle (see FIG. 11).

Figure 11:
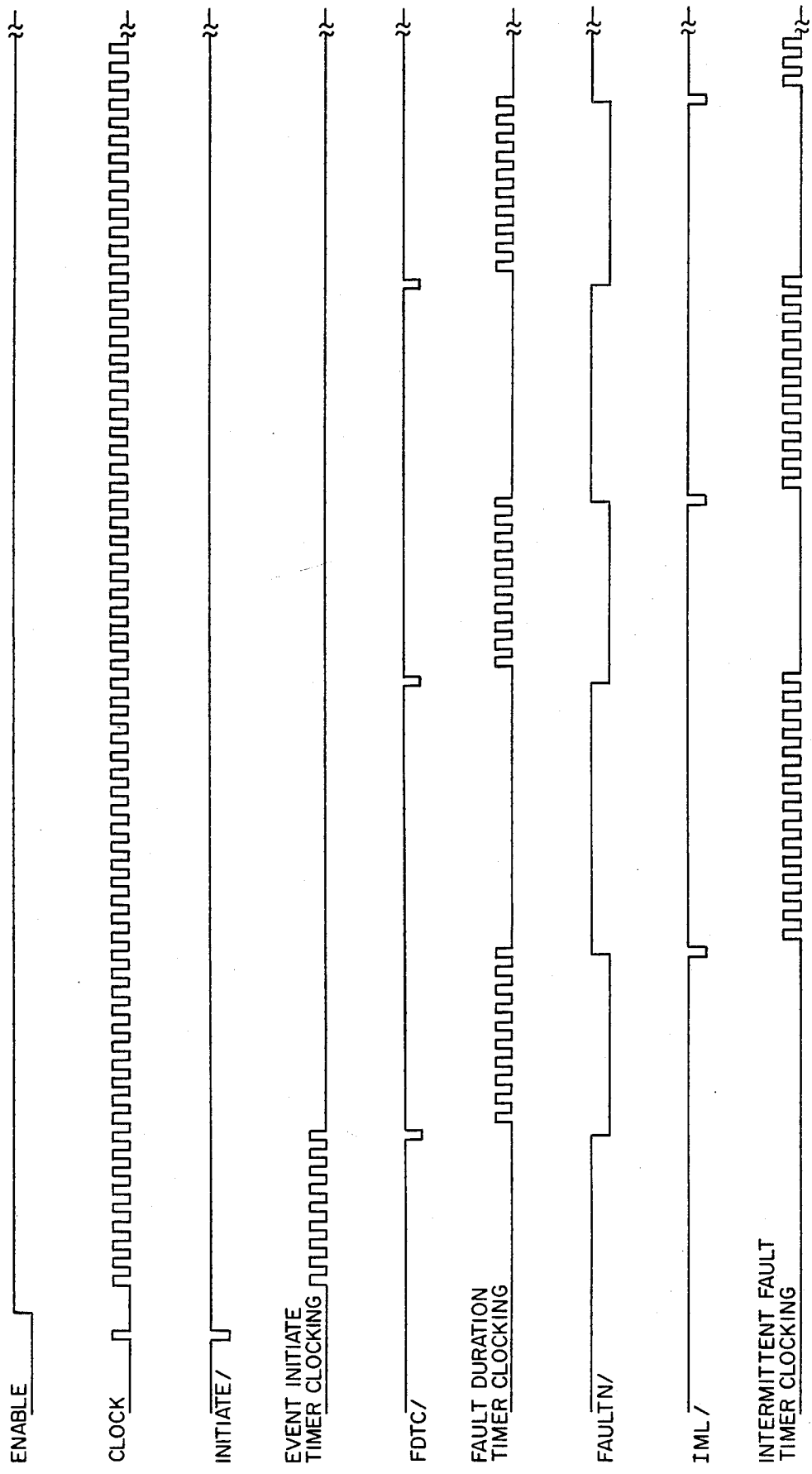
FIG. 11 shows the control and timing signals during an intermittent fault insertion cycle.

Referring now to FIGS. 1, 2, and 11, the detailed timing for an intermittent fault insertion cycle is shown in FIG. 11. It shows the inter-relationship of the timing for three fault timers 52, 54, 56 used during the fault insertion process. All three timers down-count to zero at the clock rate, after being loaded with a specified value. When a timer reaches zero, the CLOCK signal input to that timer is inhibited and a single pulse is generated in a time-out detector of that timer to perform the next required operation. Referring to FIGS. 1 and 11, notice the unequal interval between the first and second clock (before and after the zero-to-one transition of signal ENABLE). As further explained in U.S. Pat. No. 4,669,081 (Column 6, lines 16–57), the timing and control 17 function generates delays between the end of fault insertion setup and actual operational system mode. The fault(s) are inserted during system mode by the fault class generator 50 and software/hardware response to each inserted fault is analyzed by the BIT maintenance controller 12. The BIT maintenance controller 12 determines the response to the system's fault tolerant ability to detect or recover from the fault by observing either the scan out 13 signal when using scan path analysis or the status bus 25 signals when using operational, system diagnostic, software analysis.

At the end of the scan input, fault insertion set-up cycle as shown in FIG. 10, the INITIATE signal loads the event initiate delay counter 84 with the count value and the counter 84 will start decrementing upon the first clock after the ENABLE signal returns to a logic one.

The event initiate delay counter 84 continues to decrement until it reaches the zero state at which time the time-out detector 86 generates a single pulse and the down-count action of the event initiate delay counter 84 is inhibited. The time to perform this down-count represents the programmed initiate time delay prior to the first fault insertion.

The single pulse output of the time-out detector 86 in the event initiate timer 56 is one of two inputs to the fault duration timer control 58 OR-gate, which generates the signal to load the value in the fault duration register 76 into the fault duration timing counter 78, and set the fault insertion gate 64 which enables the fault type generator 16. The fault type generator 16 decodes the value in the fault word register 14 and creates the actual fault insertion signal (FAULTN/) during the time interval that the fault insertion gate 64 is set. The fault duration timing counter 78 starts decrementing upon the first clock after the fault duration register value is loaded, and it continues to decrement this value until it reaches the zero state. The fault duration timing counter 78 zero state is detected by the time-out detector 80 in the fault duration timer 54 which generates a single pulse and the down-count action of the fault duration timing counter 78 is terminated. The fault insertion gate 64 is reset (removal of signal FAULT INSERT 65) by the time-out detector 80 pulse in the fault duration timer 54 unless the fault duration register 76 was initially set up with a zero value (equal zero detector 63 generates a permanent fault).

When the intermittent fault class is enabled (intermittent fault flag 61 is set), the single pulse output of the time-out detector 80 in the fault duration timer 54 generates the intermittent fault gate (IFG/) signal which transfers the present contents of the pseudo-random number generator 70 into the random intermittent time delay counter 72 and advances (trailing edge) the pseudo-random number generator 70 to its next sequential polynominal state. If the intermittent fault flag 61 is reset (transient class), the fault word register 14 and gated fault insertion flip-flop will be reset to terminate this transient fault insertion.

The random intermittent time delay counter 72 will start decrementing upon the first clock after the pseudo-random number is loaded and the delay counter 72 continues to decrement this value until it reaches the zero state. The random intermittemt time delay counter 72 zero state is detected by the time-out detector 74 which generates a single pulse and the down-count action of the delay counter 72 is terminated. This single pulse output is the second input to the fault duration timer control 58 OR-gate, and it is the regeneration trigger for the intermittent class of fault insertion.

This concludes the description of the preferred embodiment. However, many modifications and alterations will be obvious to one of ordinary skill in the art without departing from the spirit and scope of the inventive concept. For example, the size of the fault word register is determined by the number of fault types to be generated. The order of the words in the scan input format corresponds to the serial occurrence of corresponding hardware elements; these elements may be rearranged resulting in a corresponding rearrangement of the words in the scan input format. Therefore, it is intended that the scope of this invention be limited only by the appended claims.

What is claimed is:

1. In an integrated circuit having a plurality of logic arranged for internal logic states to be held in serially accessed registers which are observable and controllable, fault insertion circuitry resident in said integrated circuit comprising:

means for generating a plurality of fault classes having a first input for receiving scan path data words and a first output coupled to an input of said serially accessed registers, said fault classes comprising a permanent fault, a transient fault and intermittent faults;

means for storing a fault word of said data words having a serial input, a serial output and a parallel output, said serial input being coupled to a second output of said fault classes generating means and said serial output being coupled to a second input of said fault classes generating means; and fault type generating means, coupled between said parallel output of said fault word storing means and said plurality of logic, for generating a fault type specified by said fault word for a time duration in accordance with a third output of said fault classes generating means.

2. The fault insertion circuitry as recited in claim 1 wherein:
said fault classes generating means comprises means for generating a transient fault for a predetermined time duration.

3. The fault insertion circuitry as recited in claim 1 wherein:
said fault classes generating means comprises means for generating a plurality of said intermittent faults, having a random time interval between each of said intermittent faults.

4. The fault insertion circuitry as recited in claim 1 wherein:
said fault type generating means comprises decoding means for selecting said fault type specified by said fault word.

5. The fault insertion circuitry as recited in claim 4 wherein:
said fault type generating means further comprises means coupled to said decoding means for interfacing said fault type to said plurality of logic in said integrated circuit.

6. The fault insertion circuitry as recited in claim 1 wherein:
said fault type generating means comprises means at a logic one level.

7. The fault insertion circuitry as recited in claim 1 wherein:
said fault type generating means comprises means for providing to said plurality of logic a fault signal stuck at a logic zero level.

8. The fault insertion circuitry as recited in claim 1 wherein:
said fault type generating means comprises means for providing to said plurality of logic a fault signal having characteristics of an open circuit.

9. The fault insertion circuitry as recited in claim 1 wherein:
said fault type generating means comprises means for providing to said plurality of logic a wired-AND bridging fault signal.

10. The fault insertion circuitry as recited in claim 1 wherein:
said fault type generating means comprises means for providing to said plurality of logic a wired-OR bridging fault signal.

11. The fault insertion circuitry as recited in claim 1 wheren:
said fault insertion circuitry comprises timing and control means for generating a plurality of control and timing signals used to shift said scan path data words to destination registers in said integrated circuit.

12. A fault insertion test system for verifying fault detection in a functional logic portion of an integrated circuit comprising:

controller means for inserting a fault under program control into said integrated circuit with control and initialization data words and for monitoring the effect of said fault on said functional logic;

means in said integrated circuit coupled to said controller means for generating a plurality of fault classes having a first input for receiving said control and initialization data words and a first output coupled to a serially accessed input of said functional logic, said fault classes comprising a permanent fault, a transient fault and intermittent faults;

means for storing a fault word of said data words having a serial input, a serial output and a parallel output, said serial output being coupled to a second output of said fault classes generating means and said serial output being coupled to a second input of said fault classes generating means; and fault type generating means, coupled between said parallel output of said fault word storing means and said functional logic, for generating a fault type specified by said fault word for a time duration in accordance with a third output of said fault classes generating means.

13. The fault insertion test system as recited in claim 12 wherein:
said controller means comprises means for performing fault insertion testing wherein said effect of said fault insertion is detected by monitoring scan out serial data from said functional logic.

14. The fault insertion test system as recited in claim 12 wherein:
said controller means comprises means for performing fault insertion testing wherein said effect of said fault insertion is detected by monitoring status data from said functional logic with diagnostic programs operating in said controller means.

15. The fault insertion test system as recited in claim 12 wherein:
said integrated circuit comprises timing and control means coupled to said controller means for generating a plurality of control and timing signals used to shift said control and initialization data words to destination registers in said integrated circuit.

16. The fault insertion test system as recited in claim 12 wherein:
said fault classes generating means comprises means for generating a transient fault for a predetermined time duration.

17. The fault insertion test system as recited in claim 12 wherein:
said fault classes generating means comprises means for generating a plurality of said intermittent faults, having a random time interval between each of said intermittent faults.

18. The fault insertion test system as recited in claim 12 wherein:
said fault type generating means comprises decoding means for selecting said fault type specified by said fault word.

19. The fault insertion test system as recited in claim 18 wherein:
said fault type generating means further comprises means coupled to said decoding means for interfacing said fault type to said plurality of logic in said integrated circuit.

20. The fault insertion test system as recited in claim 12 wherein:
said fault type generating means comprises means for providing to said plurality of logic a fault signal stuck at a logic one level.

21. The fault insertion test system as recited in claim 12 wherein:
said fault type generating means comprises means for providing to said plurality of logic a fault signal stuck at a logic zero level.

22. The fault insertion test system as recited in claim 12 wherein:
said fault type generating means comprises means for providing to said plurality of logic a fault signal having characteristics of an open circuit.

23. The fault insertion test system as recited in claim 12 wherein:
said fault type generating means comprises means for providing to said plurality of logic a wired-AND bridging fault signal.

24. The fault insertion test system as recited in claim 12 wherein:
said fault type generating means comprises means for providing to said plurality of logic a wired-OR bridging fault signal.

25. The method of fault insertion in an integrated circuit, having a plurality of logic arranged for internal logic states to be held in serially accessed registers which are observable and controllable, by fault insertion circuitry resident in said integrated circuit comprising the steps of:
generating one of a plurality of fault classes by means having a first input for receiving scan path data words and a first output coupled to an input of said serially accessed registers, said fault classes comprising a permanent fault, a transient fault and intermittent faults;
storing a fault word of said data words in a register having a serial input, a serial output and a parallel output, said serial input being coupled to a second output of said fault classes generating means and said serial output being coupled to a second input of said fault classes generating means;
generating a fault type specified by said fault word for a time duration in accordance with a third output of said fault classes generating means; and
coupling said fault type to said plurality of logic.

26. The method of fault insertion as recited in claim 25 wherein:
said step of generating a plurality of fault classes comprises the step of generating a transient fault for a predetermined time duration.

27. The method of fault insertion as recited in claim 25 wherein:
said step of generating a plurality of fault classes comprises the step of generating a plurality of said intermittent faults, having a random time interval between each of said intermittent faults.

28. The method of insertion as recited in claim 25 wherein:
said step of generating a fault type comprises the step of decoding said fault word to generate a fault type signal.

29. The method of fault insertion as recited in claim 28 wherein:
said step of generating a fault type further comprises the step of coupling said fault type signal to a circuit for interfacing said fault type to said plurality of logic in said integrated circuit.

30. The method of fault insertion as recited in claim 25 wherein:
said step of generating a fault type comprises the step of providing to said plurality of logic a fault signal stuck at a logic one level.

31. The method of fault insertion as recited in claim 25 wherein:
said step of generating a fault type comprises the step of providing to said plurality of logic a fault signal stuck at a logic zero level.

32. The method of fault insertion as recited in claim 25 wherein:
said step of generating a fault type comprises the step of providing to said plurality of logic a fault signal having characteristics of an open circuit.

33. The method of fault insertion as recited in claim 25 wherein:
said step of generating a fault type comprises the step of providing to said plurality of logic a wired-AND bridging fault signal.

34. The method of fault insertion as recited in claim 25 wherein:
said step of generating a fault type comprises the step of providing to said plurality of logic a wired-OR bridging fault signal.

35. A method for verifying fault detection in a functional logic portion of an integrated circuit comprising the steps of:
providing control and initialization data words from a controller means to said integrated circuit for programming a fault insertion;
generating one of a plurality of fault classes by means having a first input for receiving said control and initialization data words and a first output coupled to a serially accessed input of said functional logic, said fault classes comprising a permanent fault, a transient fault and intermittent faults;
storing a fault word of said control data words in a register means having a serial input, a serial output and a parallel output, said serial output being coupled to a second input of the fault classes generating means and said serial output being coupled to a second input of said fault classes generating means;
generating a fault type, specified by said fault word for a time duration in accordance with a third output of said fault classes generating means, by means coupled to said parallel output of said register means;
coupling said fault type to said functional logic in said integrated circuit; and
monitoring an effect of said fault insertion on said functional logic with said controller means.

36. The method of verifying fault detection as recited in claim 35 wherein:

said step of generating one of a plurality of fault classes comprises the step of generating a transient fault for a predetermined time duration.

37. The method of verifying fault detection as recited in claim 35 wherein:
said step of generating one of a plurality of fault classes comprises the step of generating a plurality of said intermittent faults, having a random time interval between each of said intermittent faults.

38. The method of verifying fault detection as recited in claim 35 wherein:
said step of generating a fault type comprises the step of decoding said fault word to generate a fault type signal.

39. The method of verifying fault detection as recited in claim 38 wherein:
said step of generating a fault type further comprises the step of coupling said fault type signal to a circuit for interfacing said fault type to said functional logic in said integrated circuit.

40. The method of verifying fault detection as recited in claim 35 wherein:
said step of generating a fault type comprises the step of providing to said functional logic a fault signal stuck at a logic one level.

41. The method of verifying fault detection as recited in claim 35 wherein:
said step of generating a fault type comprises the step of providing to said functional logic a fault signal stuck at a logic zero level.

42. The method of verifying fault detection as recited in claim 35 wherein:
said step of generating a fault type comprises the step of providing to said functional logic a fault signal having characteristics of an open circuit.

43. The method of verifying fault detection as recited in claim 35 wherein:
said step of generating a fault type comprises the step of providing to said functional logic a wired-AND bridging fault signal.

44. The method of verifying fault detection as recited in claim 35 wherein:
said step of generating a fault type comprises the step of providing to said functional logic a wired-OR bridging fault signal.

45. The method of verifying fault detection as recited in claim 35 wherein:
said step of monitoring said effect of said fault insertion with said controller means comprises the step of analyzing scan out serial data from said functional logic.

46. The method of verifying fault detection as recited in claim 35 wherein:
said step of monitoring said effect of said fault insertion with said controller means comprises the step of monitoring status data from said functional logic with diagnostic programs operating in said controller means.

* * * * *